United States Patent
Paulsen et al.

[11] Patent Number: 6,047,170
[45] Date of Patent: Apr. 4, 2000

[54] AUTOMATIC SQUELCH CONTROL FOR NARROW BAND AM RADIO

[75] Inventors: Roger L. Paulsen, Glendale; Colin Semwayo, Phoenix; William C. Gilbert, Scottsdale, all of Ariz.

[73] Assignee: Honeywell Inc., Minneapolis, Minn.

[21] Appl. No.: 08/902,165

[22] Filed: Jul. 29, 1997

[51] Int. Cl.[7] .................................................. H04B 1/10
[52] U.S. Cl. .......................... 455/212; 455/222; 455/218; 455/219; 331/16; 381/15
[58] Field of Search ........................... 455/212, 260, 455/180.3, 177.1, 194.1, 218, 219, 220, 222; 333/202, 206, 207, 235, 175, 174, 176; 375/217, 376, 215, 294, 327; 329/307, 325, 360

[56] References Cited

U.S. PATENT DOCUMENTS

| | | | |
|---|---|---|---|
| 3,999,132 | 12/1976 | Smith | 455/156.1 |
| 4,117,410 | 9/1978 | Bender | 329/326 |
| 4,232,393 | 11/1980 | Kumaoka et al. | 455/154.1 |
| 4,342,120 | 7/1982 | Settlemire et al. | 455/222 |
| 4,405,835 | 9/1983 | Jansen et al. | 381/15 |
| 5,408,694 | 4/1995 | Tran | 455/212 |
| 5,703,539 | 12/1997 | Gillig et al. | 331/16 |

*Primary Examiner*—Wellington Chin
*Assistant Examiner*—Isaak R. Jama

[57] ABSTRACT

An improved squelch circuit which utilizes a phase-locked-loop (PLL) arrangement to track the carrier signal and identify when audio communication should be curtailed. The lock detect circuit of the PLL is used for a signal-to-noise monitor. As the loop locks and unlocks, the lock detect line pulses. These pulses are integrated to give a direct current (DC) level. This DC level is proportional to the signal-to-noise ratio of the carrier signal. The signal-to-noise level is monitored by the squelch gate until a threshold is passed. Falling below the threshold results in a squelching of the audio, when the ratio exceeds the threshold, then audio is commenced. The circuit is enhanced by the ability to automatically adjust the threshold level once the PLL has locked onto the signal. Further, in some embodiments of the invention, the PLL also adjusts its bandwidth if the receiver's bandwidth is changed, thereby allowing the PLL to monitor the signal and not open and close the squelch intermittently when the signal strength is only marginal.

12 Claims, 9 Drawing Sheets

PLL NSQ COMPARATOR

AUTOMATIC SQUELCH CONTROL FOR NARROW BAND AM RADIO

BACKGROUND OF THE INVENTION

This invention relates generally to radios and more particularly to squelch control for AM radios.

In amplitude modulated (AM) radios, the amplitude of the carrier wave is made to vary corresponding to the fluctuations of a sound wave, a television image, or other information which is to be conveyed. AM radio transmission is the oldest and simplest form of modulation and is used almost exclusively for aviation settings and is consistently used in directional assistance for marine applications.

A major problem with AM radio transmissions is the removal of noise from the transmission and also identifying when a signal should be squelched. Squelching of a signal is done when the signal-to-noise ratio exceeds an acceptable level making the transmission unintelligible.

The signal-to-noise (SNR) problem has been compounded through the use of much narrower bandwidth. In some applications, the bandwidth has been cut in thirds; thereby lowering the SNR which acceptable.

In today's narrow band AM voice communication system for aviation, classical noise squelch circuits do not work when the channel spacing is reduced to 8.33 KHz.

Some of the traditional methods of controlling squelch are:

Audio Amplification/Rectification: The detected audio is amplified and rectified. The rectified audio is used to control the squelch gate. This method does not work reliably in a receiver that is under Automatic Gain Control (AGC) control when there is no signal present (noise only). It also does not work when there is only a carrier present.

RF Amplification/Rectification: The rectified carrier voltage is used to control the squelch gate. This method does not work for narrow band AM because the narrow band noise rectifies to almost the same level as a carrier.

Sub-Audible Tone: In this technique, a sub-audible tone is transmitted with the carrier and audio. The tone is detected in the receiver and used to control the squelch gate. This does not work in a system where there is no tone being transmitted and as such is not applicable to many AM systems.

Noise Amplified/Rectified: The rectified noise is used to control the squelch gate. This does not work in narrow band AM systems because there is no excess noise power above the audio frequency range.

Monitoring AGC Voltage: This technique monitors the AGC voltage and uses it to control the squelch gate. This is not a desirable method for many applications because the threshold does not remain constant over temperature, and because there is no way of distinguishing between noise changing the AGC voltage and signal changing the AGC voltage (at very low RF levels).

Without an effective squelching mechanism, the effectiveness of the radio is jeopardized.

It is clear that there is a significant and increasing need for an improved squelch control for AM radios as their bandwidths are narrowed.

SUMMARY OF THE INVENTION

The invention relates to an improved squelch circuit which utilizes a phase-locked-loop (PLL) arrangement to track the carrier signal and identify when audio transmission should be curtailed. The PLL determines the signals strength and cycle to create a signal-to-noise monitor.

The lock detect circuit of the PLL is used for the signal-to-noise monitor. As the loop locks and unlocks, the lock detect line pulses. These pulses are integrated to give a direct current (DC) level. This DC level is proportional to the signal-to-noise ratio of the carrier signal.

This signal-to-noise level is monitored by the squelch gate until a pre-set threshold is passed (either by being above or below the threshold). In some embodiments of the invention, the threshold is set during manufacture, while in some embodiments of the invention, the threshold value is adjusted by the operator.

Failing to meet the threshold results in a squelching of the audio, when the ratio exceeds a threshold, then audio is commenced. The squelching of the audio is accomplished by disconnecting the radio receiver from the speaker.

The circuit of this invention is enhanced by the ability to automatically adjust the threshold level once the PLL has locked onto the signal. Further, in some embodiments of the invention, the PLL also adjusts its bandwidth if the receiver bandwidth is changed. These two attributes allow the PLL to monitor the signal and not open and close the squelch intermittently when the signal strength is only marginal.

In general terms, a Phase-Locked-Loop (PLL) is a circuit that consists essentially of a phase detector which compares the frequency of a voltage-controlled oscillator with that of an incoming carrier signal or reference-frequency generator. The output of the phase detector, after passing through a loop filter, is fed back to the voltage-controlled oscillator to keep it exactly in phase with the incoming or reference frequency.

In more detail, within a PLL, the input signal is a sine or square wave of arbitrary frequency. The voltage-controlled oscillator (VCO) output signal is a sine or square wave of the same frequency as the input, but the phase angle between the two is arbitrary.

The output of the phase detector consists of a direct-current (dc) term, and components of the input frequency and its harmonics. A low-pass filter removes all alternating-current (ac) components, leaving the dc component, the magnitude of which is a function of the phase angle between the VCO signal and the input signal. A change in the angle between these signals produces a change in the dc control voltage in such a manner as to vary the frequency of the VCO to track the frequency of the input signal.

Two qualities of the loop specify its performance. One is the hold-in range, while the other is the pull-in range. The hold-in range is the maximum change in input frequency for which the loop remains locked. It is governed by the dc gain of the loop. As the input frequency is changed, the change in phase of the two signals to the phase detector produces a dc control voltage that changes the frequency of the VCO.

As the input frequency is further changed, the phase angle continues to increase until it reaches 0 or 180 degrees, when the loop will unlock.

If an amplifier is added to the loop, a greater control voltage is generated which decreases the phase error in the phase detector, and hence further detuning can occur before unlocking takes place.

The pull-in range is that range of frequencies that the loop locks to if it is initially unlocked. Suppose the loop is unlocked and the VCO is running a frequency $f_1$. If the input signal $f_2$ is applied, a beat note $f_1-f_2$ appears at the output of the phase detector. The filter components govern the amplitude of this beat note at the input to the VCO.

At some point, the amplitude drives the VCO far enough over in frequency to match the input frequency and locking occurs.

Phase-locked loops are generally designed to have narrower pull-in range than hold-in range. This is the advantage of a PLL over conventional types of filters. The pull-in range is analogous to filter bandwidth and is made as narrow as desired by suitable choice of the resistance-capacitance (RC) filter and other loop parameters, while the center frequency is any desired value.

When the PLL is operating as a demodulator, the PLL is often thought of as a multiplier operating as a coherent detector. If the PLL is used to track a carrier, the PLL acts as a narrow-band filter for removing noise from the signal and regenerating a clean replica of the signal.

Those of ordinary skill in the art recognize that a large number of PLL circuitry exist. Each circuit design has its own special attributes and advantages and are chosen to meet the specific application.

The use of a PLL as a squelch circuit is particularly advantageous when there is no excess noise bandwidth available for classical noise squelch.

The PLL's operation is enhanced when the receiver's intermediate frequency (I.F.) is used as the PLL's reference. The I.F. is the frequency produced by mixing the received signal with that of a local oscillator.

A phase locked loop works as a squelch circuit when the receiver I.F. is used as the reference frequency for the PLL. When the receiver is receiving a desired, on channel signal, the PLL has a reference signal, and the loop locks. When the receiver is not receiving a desired, on channel signal, there is only noise present for the PLL reference, and the loop is unable to lock. The PLL's lock detect is then used to determine when to enable or disable the receiver's audio output.

When the receiver is receiving a weak, desired, on channel signal, the PLL has a noisy reference signal. Depending on the signal-to-noise ratio of the signal at the input to the phase locked loop, the PLL locks and unlocks periodically. The rate at which the PLL slips cycles (momentarily unlocks), is predictable depending on the signal-to-noise ratio of the signal at the input to the PLL, the loop bandwidth of the PLL, and the bandwidth of the signal at the input to the PLL.

As the signal at the input to the PLL gets weaker (lower signal to noise ratio), the PLL slips cycles more frequently. By averaging the amount of time that the loop is locked (or unlocked), the signal-to-noise ratio (SNR) of the received signal at the input to the PLL is determined, and the squelch is opened when the SNR reaches the desired level.

In some embodiments of the invention, hysteresis is built into the squelch by closing the squelch at a lower SNR than it opened at (longer average time between cycle slips).

The main advantage of this type of squelch is that it works with any bandwidth and channel spacing.

The invention, together with various embodiments thereof, will be more fully explained by the accompanying drawings and the following description.

DRAWINGS IN BRIEF

DRAWINGS IN DETAIL

Figure 1:
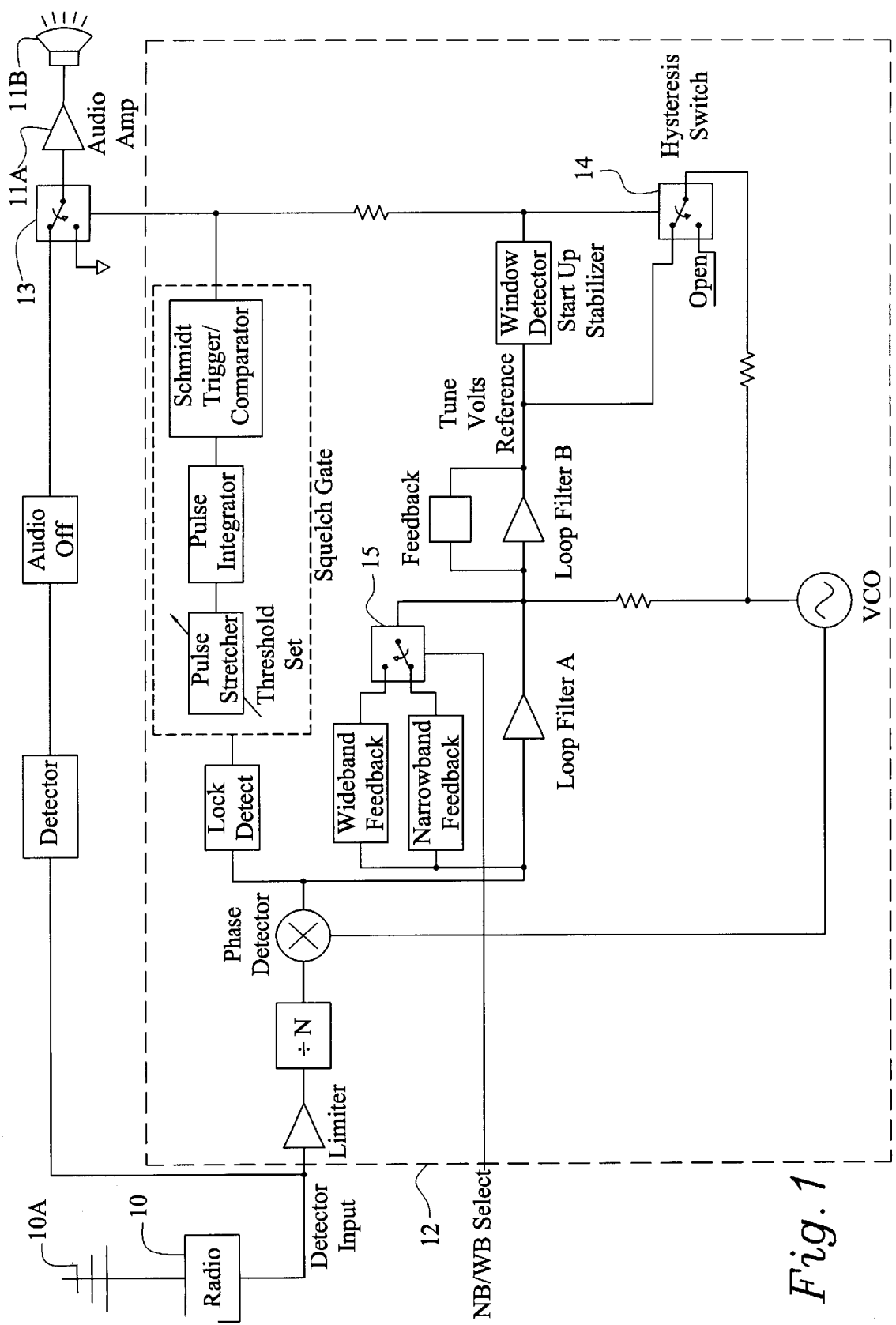
FIG. 1 is a functional layout of the preferred embodiment.

FIG. 1 is a functional layout of the preferred embodiment.

In this preferred embodiment of the invention, radio 10, with the assist of antenna 10A receives a signal. This signal is passed to the both the phase-lock-loop circuit 12 and also to the audio system (audio amplifier 11A and speaker 11B).

Connection between the radio 10 and the audio amplifier 11A is controlled by the Phase-Lock-Loop (PLL) 12 using squelch open/closed switch 13.

PLL 12 uses the receiver's I.F. as the reference frequency for PLL 12. When the receiver is receiving a desired, on channel signal, PLL 12 has a reference signal, and the loop locks; otherwise, there is only noise present for the PLL reference, and the loop is unable to lock. In a similar fashion, when the receiver is receiving a weak, desired, on channel signal, PLL 12 has a noisy reference signal which causes PLL 12 to lock and unlock periodically.

By averaging the amount of time that PLL 12 is locked (or unlocked), the signal-to-noise ratio (SNR) of the received signal at the input to PLL 12 is determined, and the squelch is opened when the SNR reaches the desired level.

In this embodiment of the invention, hysteresis switch 14 makes it possible to close the squelch control switch 13 at a lower SNR than it opened at (longer average time between cycle slips). It does this by changing the Vco gain which causes a change in the loop bandwidth. This attribute provides for a dynamic response which avoids excessive cycle slips when a signal is only marginal.

Further, in this embodiment of the invention, a selection of either narrow-band or wide-band monitoring is possible through selective activation of switch 15. This attribute of this preferred embodiment permits the radio shown to be able to address a variety of bandwidths as required by the transmitting station.

Figures 1, 2A:
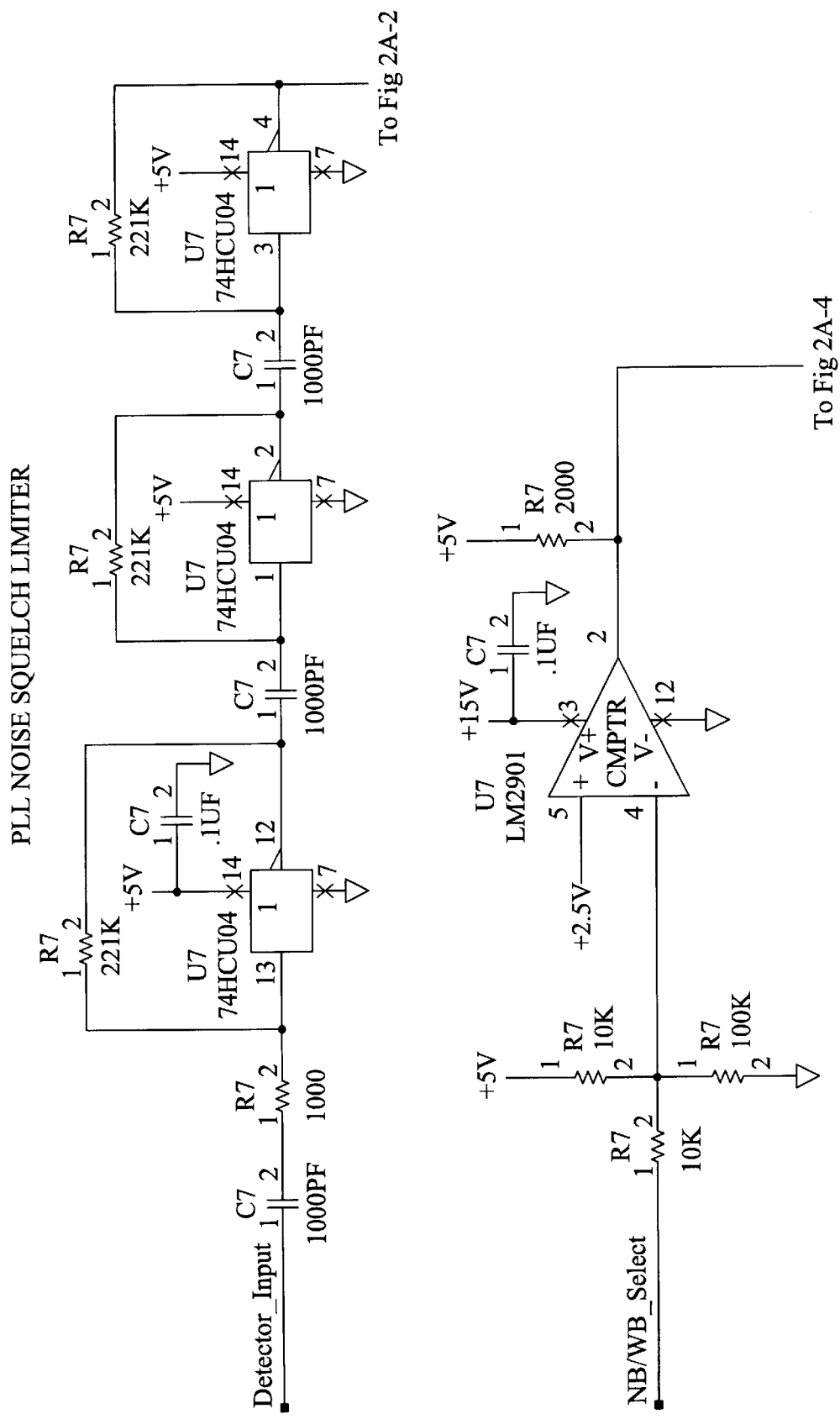
FIGS. 2A and 2B are electrical schematics of components of the preferred embodiment.
Figures 2, 2A:
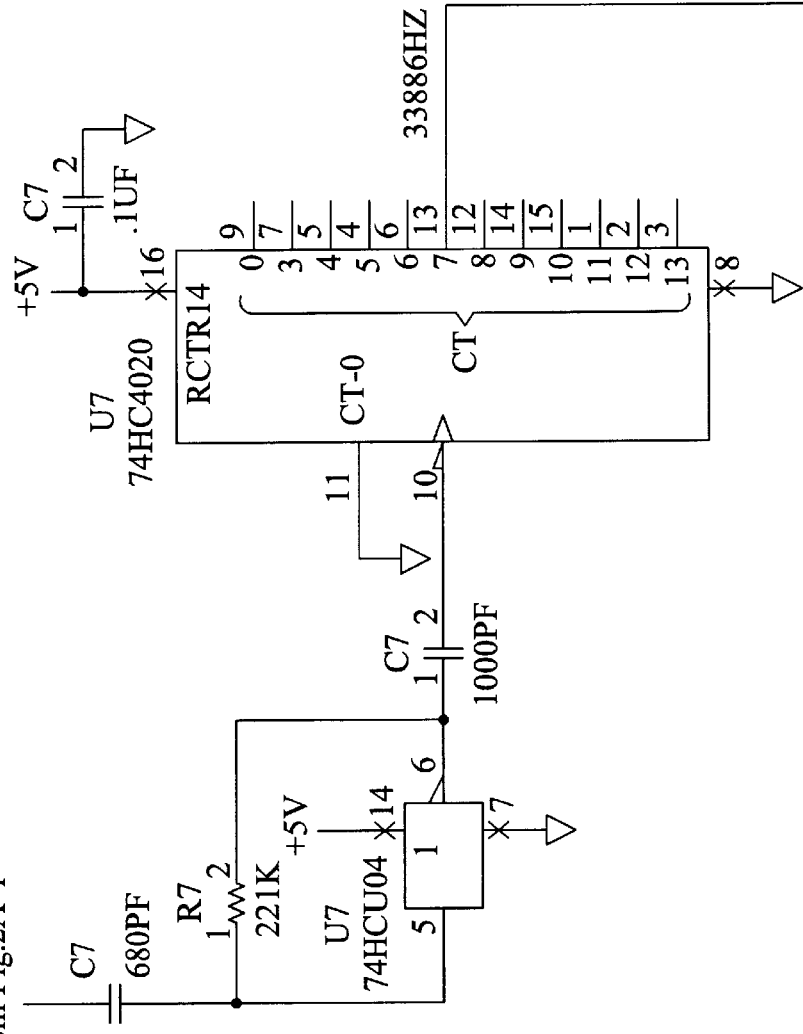
Figures 2, 2A, 3:
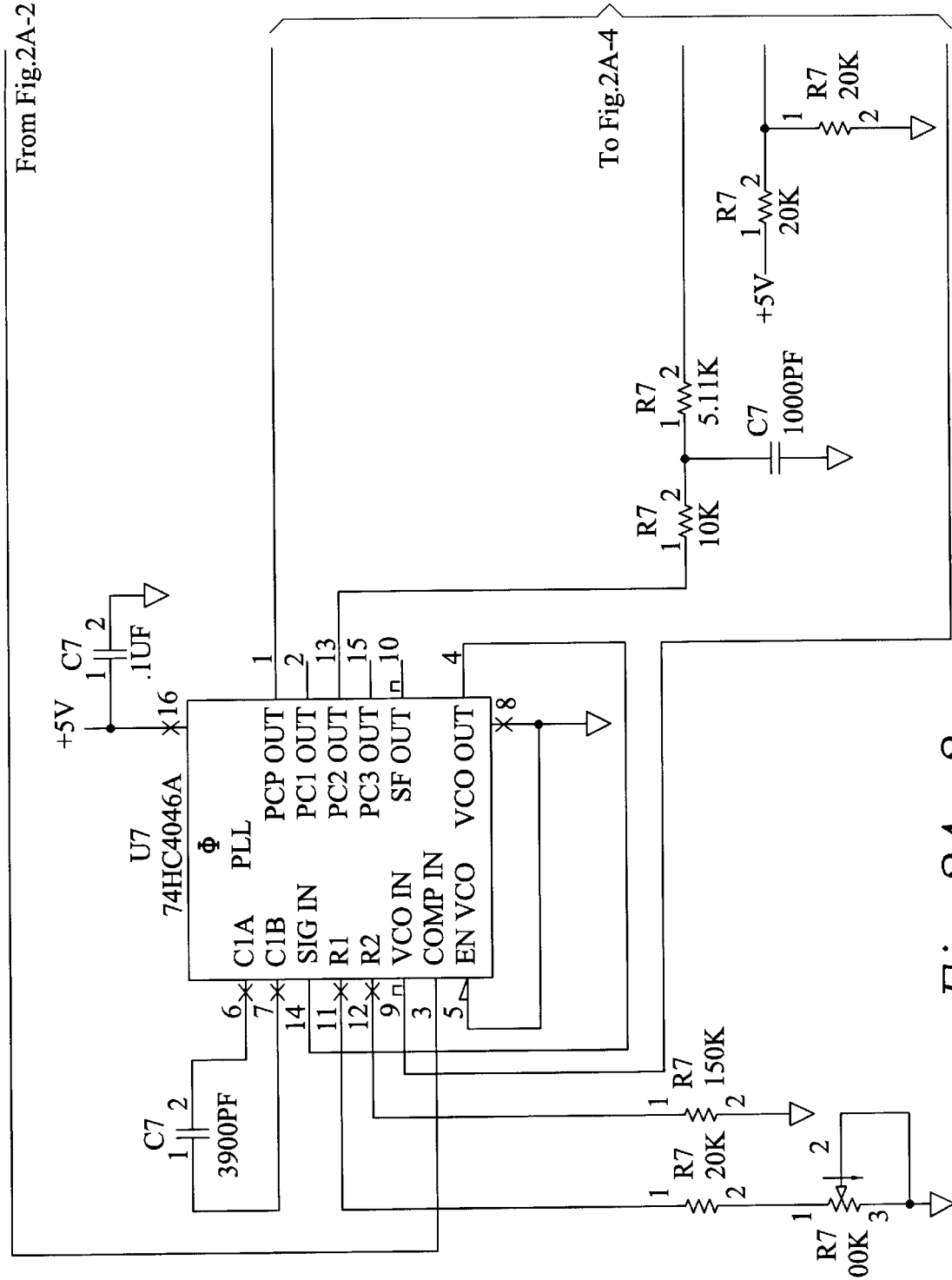
Figures 2, 2A, 3, 4:
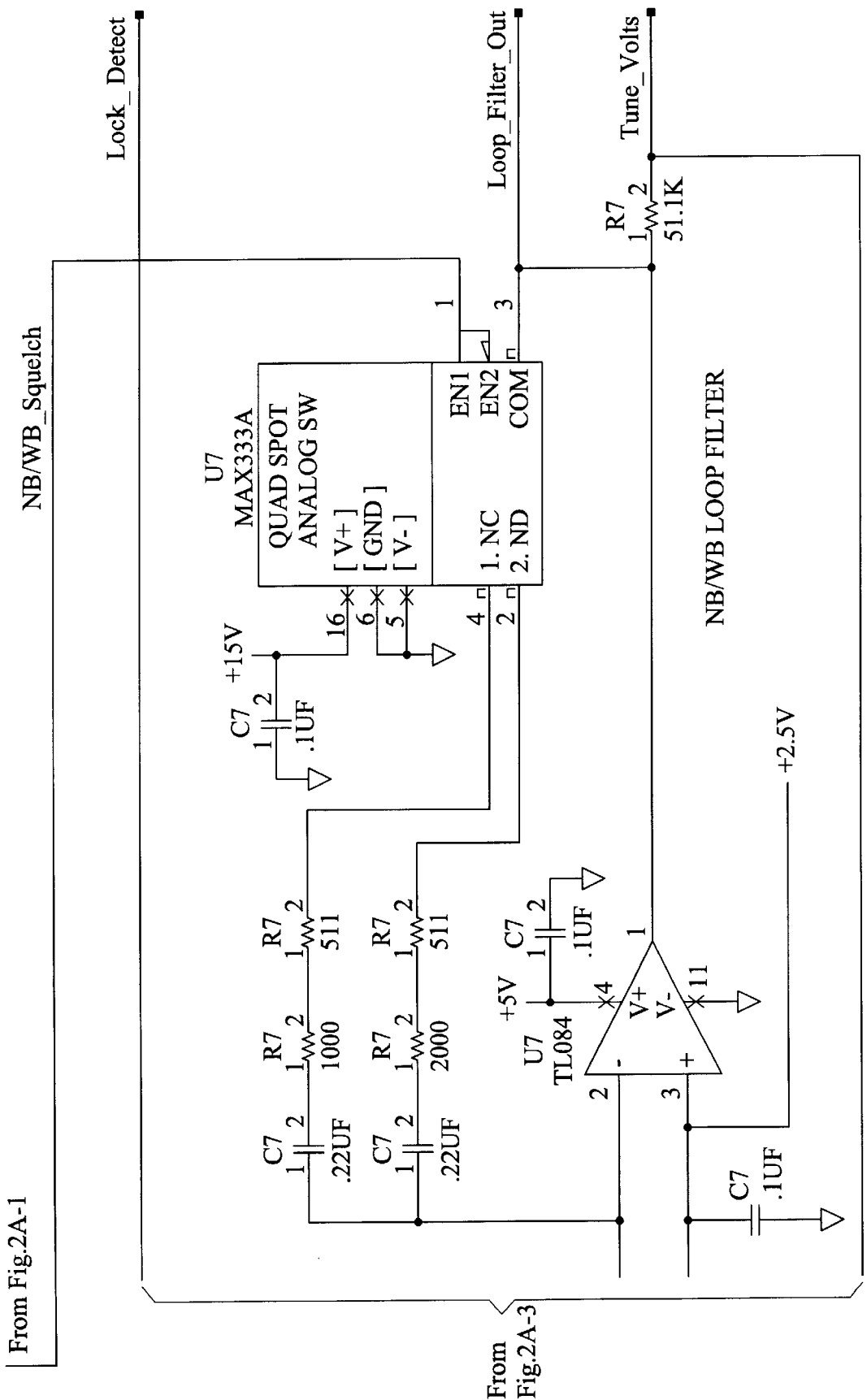
Figures 1, 2B:
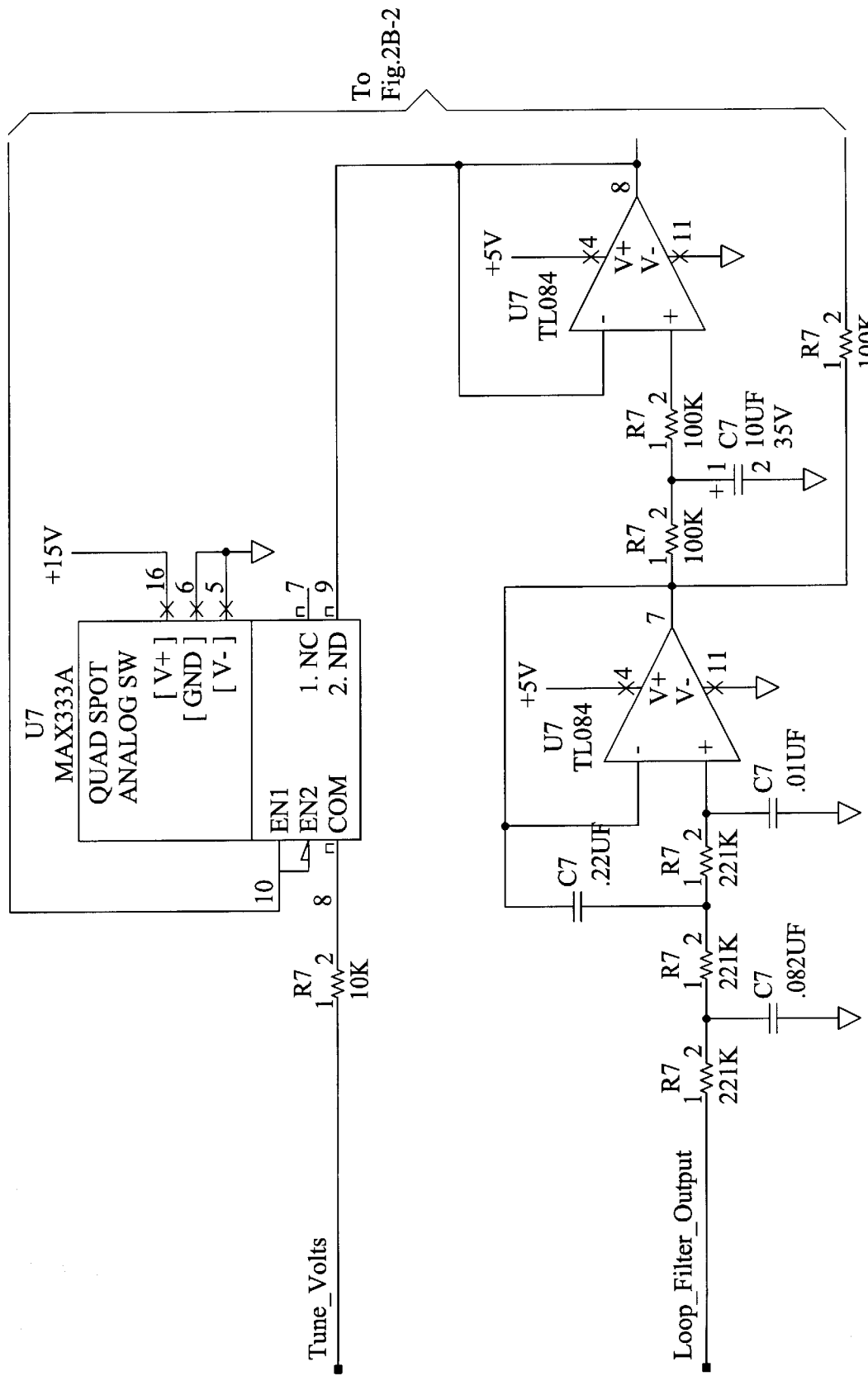
Figures 2, 2B:
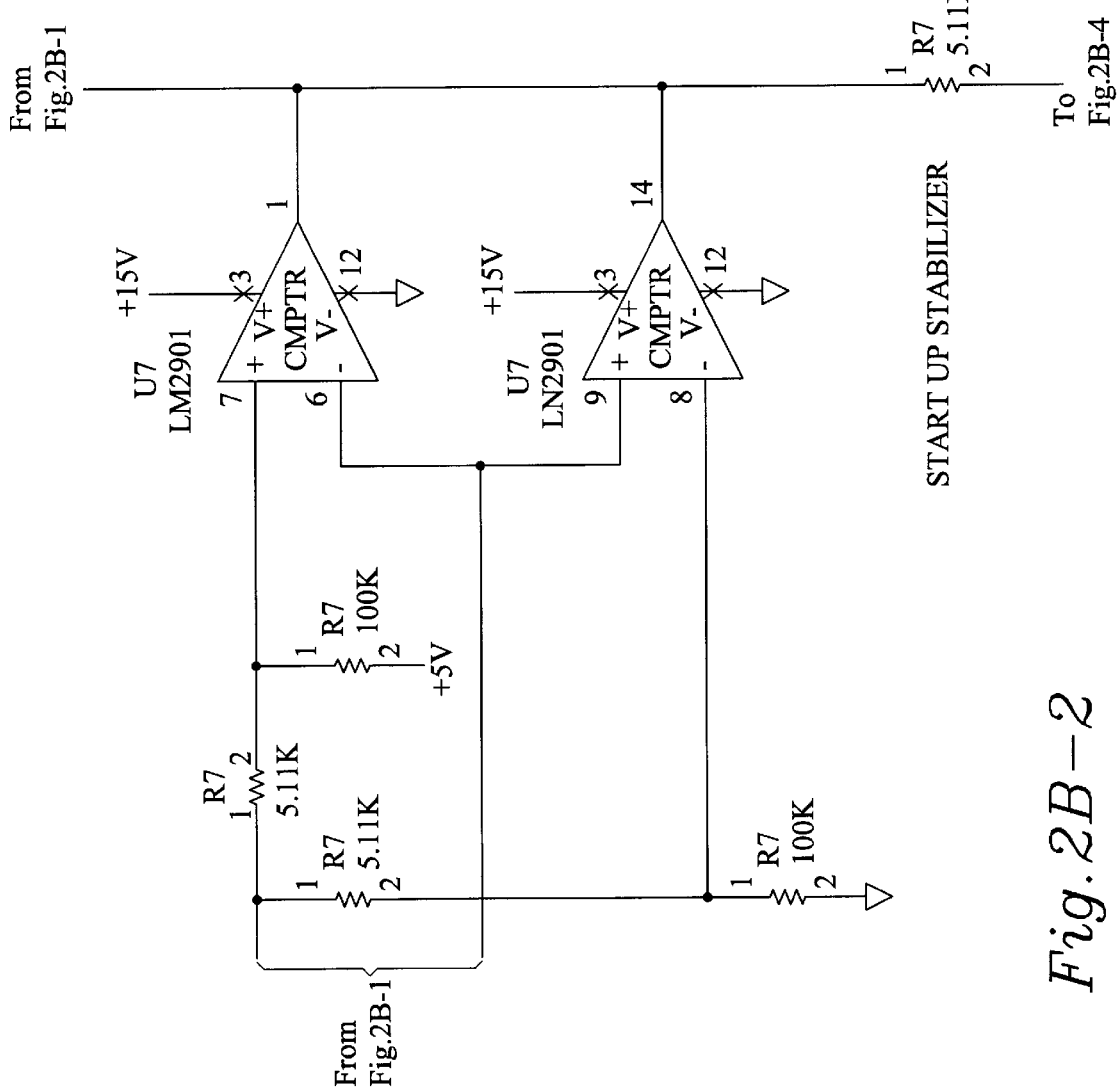
Figures 2, 2B, 3:
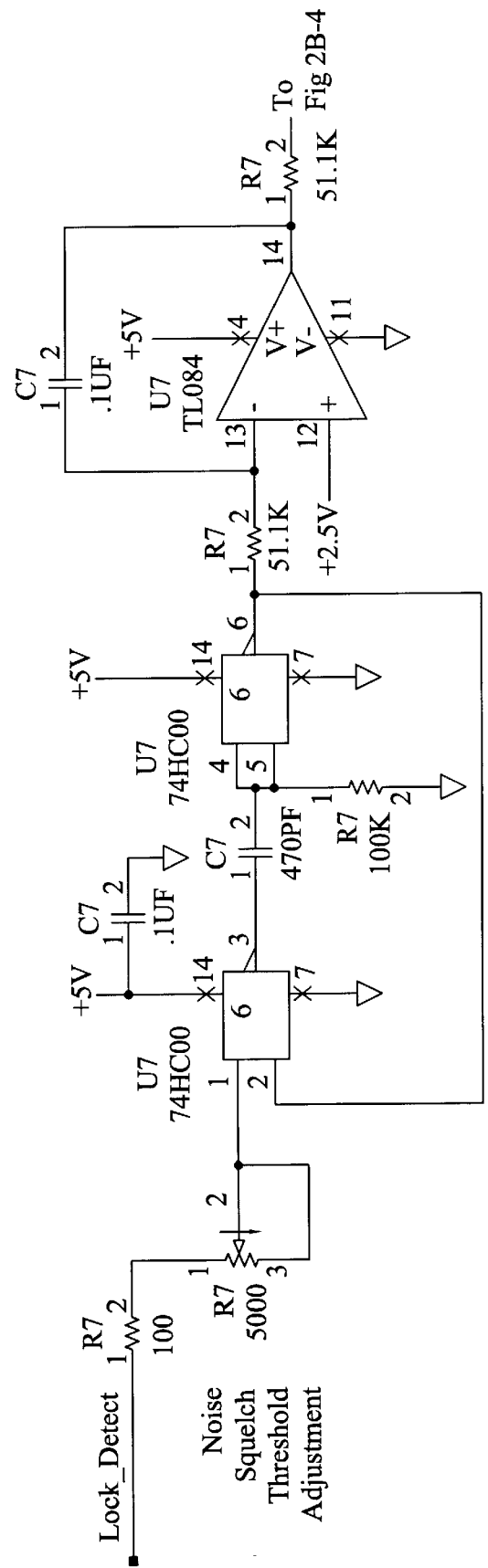
Figures 2, 2B, 3, 4:
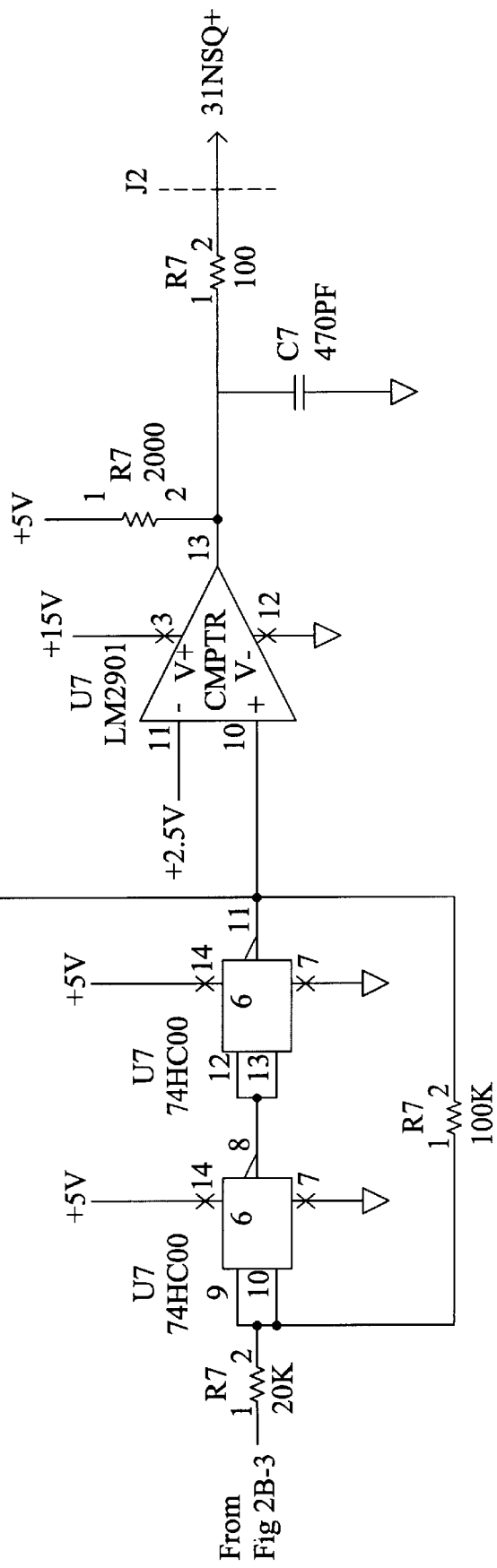

The electronics used in PLL 12 shown in FIG. 1 are laid out in the schematic of FIGS. 2A and 2B and are to be used in conjunction with each other.

Although the electronic arrangement of FIGS. 2A and 2B are the preferred layout, the invention is not intended to be so limited; those of ordinary skill in the art readily recognize a variety of other phase-lock-loops which will serve in the function outlined above.

It is clear from the foregoing that the present invention creates a highly effective and versatile squelch control circuitry which assists a wide range of AM radios.

What is claimed is:

1. A circuit comprising:
   a) means for receiving a radio signal at a selected frequency and at a selected bandwidth;
   b) means for communicating an auditory signal to a user based upon said radio signal;
   c) based on an intermediate frequency and said radio signal, means for disconnecting said means for communicating from said means for receiving if a carrier signal of said radio signal falls below a selected signal-to-noise threshold level, said means for disconnecting including a phase-lock-loop circuit, wherein said phase-lock-loop circuit includes means for adjusting said selected threshold level and further including means for selectively lowering said threshold level.

2. The circuit according to claim 1, wherein said means for selectively lowering said threshold level is responsive to activation of said means for communicating.

3. The circuit according to claim 1, further including means for selectively adjusting a bandwidth of said phase-lock-loop.

4. The circuit according to claim 3, wherein said means for selectively adjusting the bandwidth is responsive to said carrier signal.

5. The circuit according to claim 3, wherein said means for selectively adjusting a bandwidth of said phase-lock-loop is responsive to the selected bandwidth of said means for receiving.

6. A squelch circuit for a radio receiver receiving radio waves at a selected frequency and at a selected bandwidth and communicating an auditory signal representative thereof, said squelch circuit comprising:
   a) a phase-lock-loop adapted to monitor and lock onto a carrier signal from said radio receiver; and,
   b) means for discontinuing all auditory signals if the carrier signal falls below a selected threshold level as defined by the phase-lock-loop, wherein said phase-lock-loop circuit includes means for adjusting said selected threshold level.

7. The squelch circuit according to claim 6, wherein said means for selectively lowering said threshold level is responsive to activation of said means for disconnecting.

8. The squelch circuit according to claim 6, wherein said means for discontinuing includes means for selectively adjusting a bandwidth of said phase-lock-loop.

9. The squelch circuit according to claim 6, wherein said means for selectively adjusting the bandwidth is responsive to said carrier signal.

10. The squelch circuit according to claim 6, wherein said means for selectively adjusting a bandwidth of said phase-lock-loop is responsive to the selected bandwidth of said radio receiver.

11. A circuit comprising:
   a) a receiver configured to receive a radio signal at a selected frequency and at a selected bandwidth;
   b) a speaker configured to communicate an auditory signal to a user based upon said radio signal;
   c) a disconnector circuit having a phase-lock-loop, said disconnector circuit being configured to disconnect said speaker from said receiver if a carrier signal of said radio signal falls below a selected signal-to-noise threshold level, wherein said phase-lock-loop is configured to adjust said selected threshold level.

12. The circuit of claim 11 wherein said phase-lock-loop is further configured to selectively lower said threshold level.

* * * * *